(12) United States Patent
Nakamura (10) Patent No.: US 11,778,742 B2
(45) Date of Patent: Oct. 3, 2023

(54) THROUGH-HOLE VIA AND CIRCUIT BOARD

(71) Applicant: NEC Platforms, Ltd., Kawasaki (JP)

(72) Inventor: Takuya Nakamura, Kanagawa (JP)

(73) Assignee: NEC Corporation, Tokyo (JP)

( * ) Notice: Subject to any disclaimer, the term of this patent is extended or adjusted under 35 U.S.C. 154(b) by 18 days.

(21) Appl. No.: 17/437,598

(22) PCT Filed: Mar. 16, 2020

(86) PCT No.: PCT/JP2020/011367
§ 371 (c)(1),
(2) Date: Sep. 9, 2021

(87) PCT Pub. No.: WO2020/189610
PCT Pub. Date: Sep. 24, 2020

(65) Prior Publication Data
US 2022/0159835 A1    May 19, 2022

(30) Foreign Application Priority Data
Mar. 19, 2019    (JP) .................................. 2019-051030

(51) Int. Cl.
*H05K 1/02* (2006.01)
*H05K 1/11* (2006.01)

(52) U.S. Cl.
CPC .......... *H05K 1/116* (2013.01); *H05K 1/0251* (2013.01); *H05K 1/0298* (2013.01); *H05K 2201/09645* (2013.01)

(58) Field of Classification Search
CPC .... H05K 1/116; H05K 1/0298; H05K 1/0251; H05K 3/429; H05K 2201/09645; H05K 3/403; H05K 1/113
See application file for complete search history.

(56) References Cited

U.S. PATENT DOCUMENTS 6,388,208 B1 *    5/2002    Kiani ................... H05K 1/0222
                                                        174/266
10,405,418 B2 *    9/2019    Hsu ....................... H05K 1/0251
(Continued)

FOREIGN PATENT DOCUMENTS

JP    2004-146810 A    5/2004
JP    2008-518486 A    5/2008
(Continued)

OTHER PUBLICATIONS

International Search Report for PCT Application No. PCT/JP2020/011367, dated Apr. 7, 2020.
(Continued)

*Primary Examiner* — Steven T Sawyer
(74) *Attorney, Agent, or Firm* — Michael Dryja (57) ABSTRACT

A through-hole via penetrating, in a thickness direction, through a circuit board provided with multiple wiring layers in which a conductor pattern is formed on a surface of an insulating layer, wherein the through-hole via has a first through-hole conductor that is disposed inside a hole penetrating through the circuit board and that is formed from a conductor; a second through-hole conductor that is disposed inside the hole so as to be spaced, in a circumferential direction of the hole, from the first through-hole conductor; a first land portion that connects the first through-hole conductor to the conductor pattern on one insulating layer; and a second land portion that connects the first through-hole conductor with the second through-hole conductor on another insulating layer different from the one insulating layer.

4 Claims, 8 Drawing Sheets

(56) References Cited

U.S. PATENT DOCUMENTS

| | | |
|---|---|---|
| 2004/0251047 A1 | 12/2004 | Bartley et al. |
| 2005/0152184 A1* | 7/2005 | Chiu ................. H05K 1/165 |
| | | 365/185.02 |
| 2005/0231927 A1* | 10/2005 | Masuyama ........... H05K 1/115 |
| | | 174/262 |
| 2006/0090933 A1 | 5/2006 | Wig et al. |
| 2008/0017411 A1 | 1/2008 | Chen |
| 2008/0308313 A1 | 12/2008 | Gorcea |
| 2009/0122498 A1* | 5/2009 | Lan ................... H05K 1/115 |
| | | 361/778 |
| 2010/0012366 A1 | 1/2010 | Takeda |
| 2016/0378215 A1* | 12/2016 | Xiao .................. H05K 1/116 |
| | | 345/173 |
| 2019/0208619 A1* | 7/2019 | Zhang ................ H05K 1/0234 |

FOREIGN PATENT DOCUMENTS

| | | |
|---|---|---|
| JP | 2010-027654 A | 2/2010 |
| JP | 2013-143461 A | 7/2013 |
| JP | 2014-229865 A | 12/2014 |
| JP | 2016-181623 A | 10/2016 |

OTHER PUBLICATIONS

Japanese Office Communication for JP Application No. 2019-051030 dated Jun. 30, 2020 with English Translation.

* cited by examiner

FIG. 6D  PRIOR ART

THROUGH-HOLE VIA AND CIRCUIT BOARD

This application is a National Stage Entry of PCT/JP2020/011367 filed on Mar. 16, 2020, which claims priority from Japanese Patent Application 2019-051030 filed on Mar. 19, 2019, the contents of all of which are incorporated herein by reference, in their entirety.

TECHNICAL FIELD

The present invention relates to a through-hole via and a circuit board.

BACKGROUND ART

In so-called multilayer printed boards in which a conductor circuit pattern is provided across multiple layers, the wiring layer of signal wiring sometimes transitions between a circuit pattern on one layer and a circuit pattern on another layer, by means of a through-hole via, i.e., a rod-shaped (or tubular) conductor that is arranged to penetrate through multiple wiring layers.

When transitioning between wiring layers in this way, conductors that are connected to the circuit patterns and that are located on paths other than the signal transmission path of the through-hole via form stubs, which can be a cause of degradation of signal transmission.

The longer these stubs are, the more signal transmission is affected towards signal degradation. Thus, signal wiring layers are adjusted to make stubs shorter. Additionally, if the stubs become long, then the portions that will form stubs are removed by machining, such as by back-drilling, in a separate step performed afterwards, to make the stubs as short as possible.

Technologies relating to such measures taken against stubs are described in Patent Documents 1, 2, and 3.

Patent Document 1 proposes a technology for reducing parasitic capacitance caused by stubs by removing portions of through-holes, for example, by a machining process known as back-drilling. FIG. 6A to FIG. 6D schematically illustrate an example of machining by back-drilling associated with Patent Document 1.

A circuit conductor 92 is provided on the surface of a multilayer board 91. This circuit conductor 92 is connected to a ring-shaped land on the upper surface of a continuous cylindrical through-hole via 93. The through-hole via 93 is formed by boring a through-hole penetrating in the thickness direction through the multilayer board 91 having multiple circuit board layers 94, and providing a conductor on the inner side thereof. Additionally, in this multilayer board 91, a process for forming a back-drill hole 95 is performed by cutting the side opposite to the circuit conductor 92, i.e., the lower surface in FIG. 6B, with a machine tool such as a drill, thereby removing a portion of the through-hole via 93 together with the multilayer substrate 91. In other words, this process is a process for minimizing the stub by reducing the area of the conductor constituting the through-hole via 93.

Figure 6A:
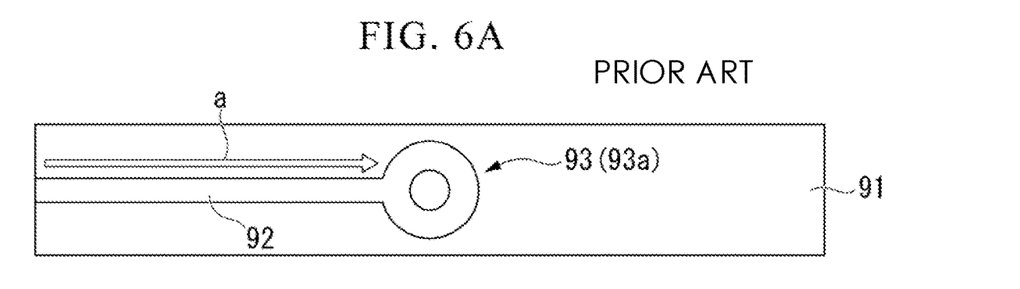
FIG. 6A is a top view illustrating hole formation by a back drill relating to an embodiment, a perspective view of only a through-hole via portion and a back-drill portion.
Figure 6B:
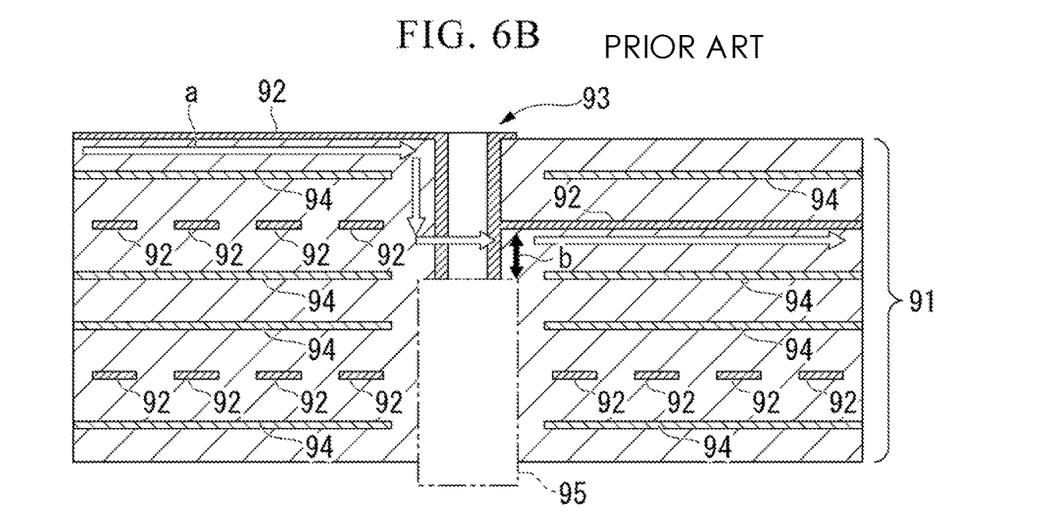
FIG. 6B is a section view illustrating hole formation by a back drill relating to the embodiment.
Figure 6C:
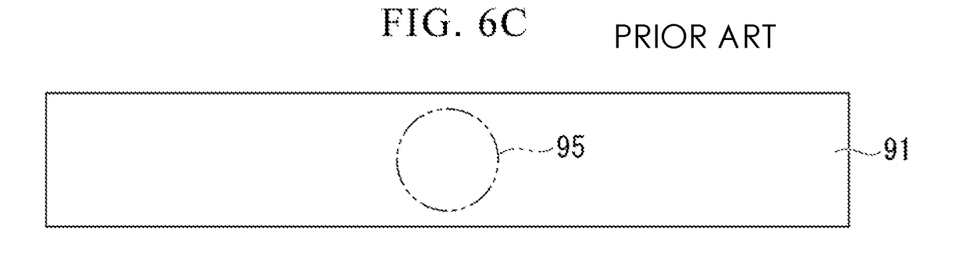
FIG. 6C is a bottom view illustrating hole formation by a back drill relating to the embodiment.
Figure 6D:
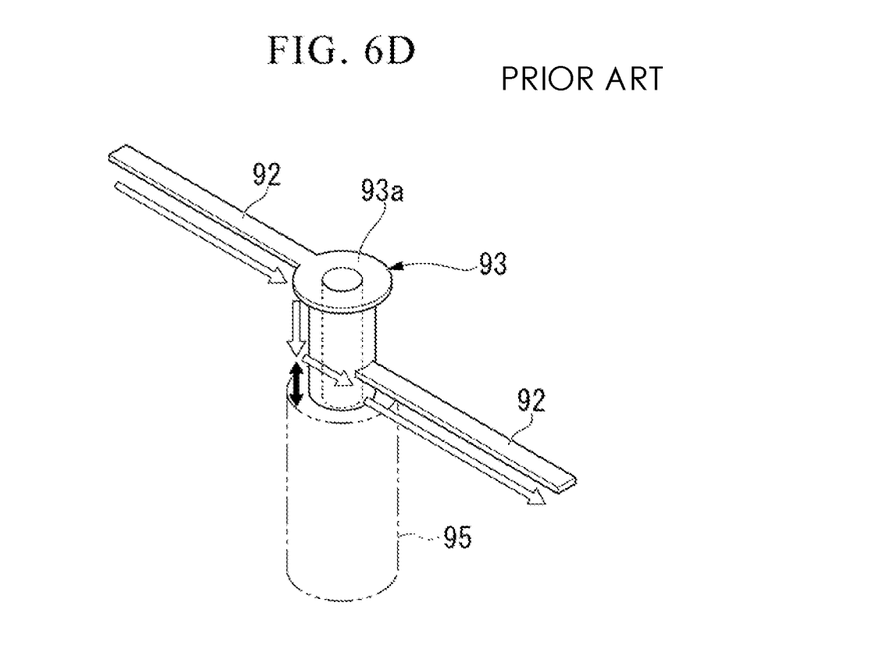
FIG. 6D is a perspective view of only a through-hole via portion and a back-drill portion relating to the embodiment.

In other words, by forming the back-drill hole 95, the signal path indicated by the arrow a in FIG. 6B is formed by the circuit conductor 92 in the multilayer substrate 91, and the conductor that is unrelated to the signal path is removed by the back-drill hole 95. As a result thereof, the range of the stub is shortened to the range indicated by the arrow b in FIG. 6B.

CITATION LIST

Patent Literature

[Patent Document 1]
   Japanese Unexamined Patent Application, First Publication No. 2013-143461
[Patent Document 2]
   Japanese Unexamined Patent Application, First Publication No. 2014-229865
[Patent Document 3]
   Japanese Unexamined Patent Application, First Publication No. 2016-181623

SUMMARY OF THE INVENTION

Problems to be Solved by the Invention

However, although machining for removing stubs by back-drilling as illustrated in FIG. 6A to FIG. 6D can keep stubs short, the process has the following problem. Namely, in addition to a machining step for forming the through-hole in the substrate and steps such as masking and plating for providing the conductor in the through-hole, a machining step using a back drill is also needed.

Additionally, back-drilling forms a hole (back-drill hole 95) having a diameter larger than that of the through-hole via 93, thus reducing the mountable area of the multilayer board 91. As a result thereof, when planning the mounting layout for the multilayer substrate or when designing conductor patterns, consideration must be given to avoid the areas that are to be back-drilled and the like. In other words, there are problems in that the level of freedom in the mounting layouts of multilayer substrates is restricted, and furthermore, increases in the mounting densities in multilayer substrates are hindered.

Additionally, a stub processing technology described in Patent Document 2 involves covering the end of a through-hole with an electrical conductor. However, this requires a step for providing this electrical conductor to be further added to the production steps.

Additionally, a stub processing technology described in Patent Document 3 merely involves dividing the conductor in the through-hole. In other words, specific configurations for application to so-called multilayer substrates in which multiple layers of conductor patterns are stacked have not yet been developed.

The present invention proposes a method for reducing stubs, which cause signal degradation in boards with multilayer configurations, by machining through-hole vias that change signal transmission paths, the method being different from adjustment of the wiring layers or back-drilling, which are conventional stub reduction methods.

Means for Solving the Problems

In order to solve the above-mentioned problems, the through-hole via according to a first aspect of the present invention is a through-hole via penetrating, in a thickness direction, through a circuit board provided with multiple wiring layers in which a conductor pattern is formed on a surface of an insulating layer. The through-hole via has a first through-hole conductor that is disposed inside a hole penetrating through the circuit board and that is formed from a conductor; a second through-hole conductor that is disposed inside the hole so as to be spaced, in a circumferential direction of the hole, from the first through-hole conductor;

a first land portion that connects the first through-hole conductor to the conductor pattern on one insulating layer; and a second land portion that connects the first through-hole conductor with the second through-hole conductor on another insulating layer different from the one insulating layer.

Advantageous Effects of Invention

According to the present invention, the lengths of via stubs can be shortened while minimizing design changes in mounting layouts and conductor patterns of multilayer boards.

DESCRIPTION OF EMBODIMENTS

Figure 1A:
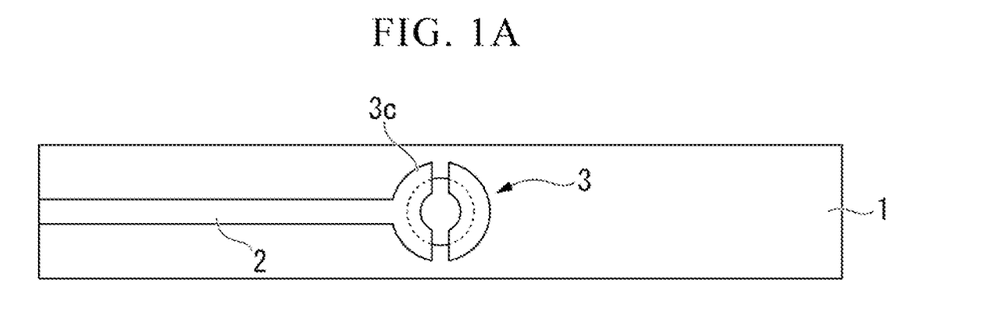
FIG. 1A is a top view illustrating a minimum configuration of a through-hole via according to an embodiment.
Figure 1B:
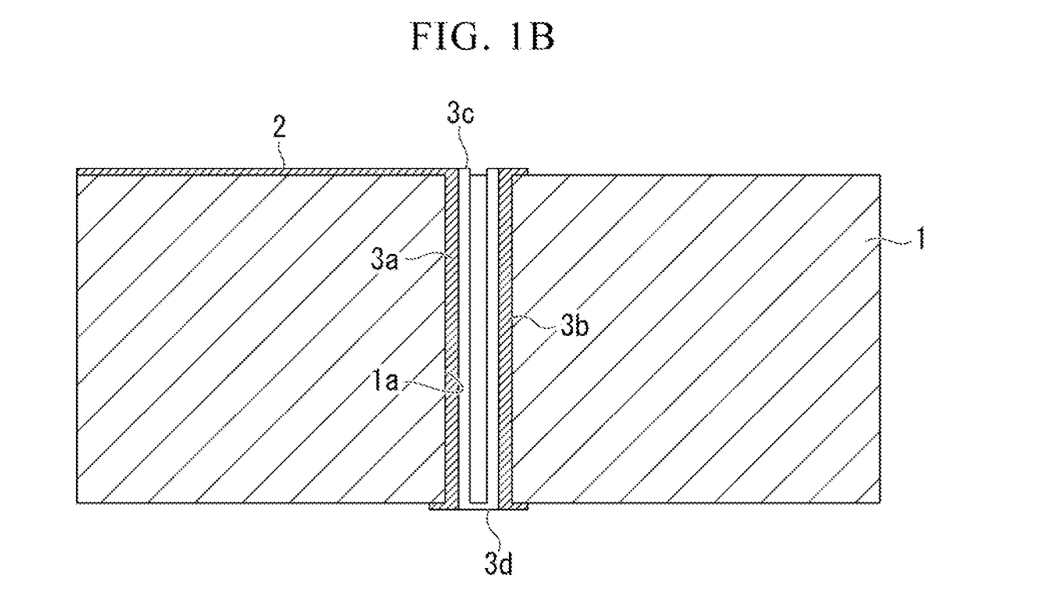
FIG. 1B is a section view illustrating the minimum configuration of the through-hole via according to the embodiment.
Figure 1C:
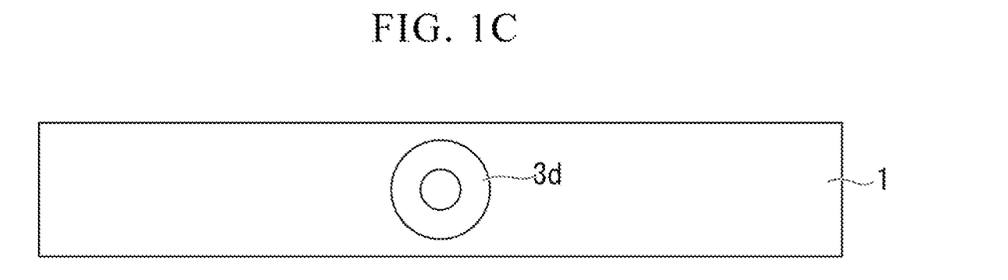
FIG. 1C is a bottom view illustrating the minimum configuration of the through-hole via according to the embodiment.

A through-hole via according to a minimum configuration of the present embodiment will be explained by referring to FIG. 1A to FIG. 1C. FIG. 1A is a top view of the through-hole via, FIG. 1B is a section view of the through-hole via, and FIG. 1C is a bottom view of the through-hole via.

A circuit board 1 is provided with multiple wiring layers in which a conductor pattern 2 is formed on the surface of an insulating layer. A through-hole via 3 that penetrates through in the thickness direction is formed in this circuit board 1.

This through-hole via 3 has a first through-hole conductor 3a, a second through-hole conductor 3b, a first land portion 3c, and a second land portion 3d. The first through-hole conductor 3a is disposed inside a through-hole 1a that penetrates through the circuit board 1, and is formed from a conductor. The second through-hole conductor 3b is disposed inside the through-hole 1a so as to be spaced from the first through-hole conductor 3a. The first through-hole conductor 3a and the second through-hole conductor 3b are disposed, so as to be separated, inside the through-hole 1a. The first land portion 3c connects the first through-hole conductor 3a to the conductor pattern 2 on one insulating layer (the upper surface layer in FIG. 1A to FIG. 1C). The first land portion 3c does not electrically connect the first through-hole conductor 3a with the second through-hole conductor 3b. The second land portion 3d connects the first through-hole conductor 3a with the second through-hole conductor 3b, on another insulating layer (the lower surface layer in FIG. 1A to FIG. 1C), which does not have any signal connections, other than the one insulating layer. The second land portion 3d electrically connects the first through-hole conductor 3a with the second through-hole conductor 3b.

In the through-hole via 3 having the above-mentioned configuration, the second through-hole conductor 3b, which is separated from the first through-hole conductor 3a, is electrically connected by the second land portion 3d on the lower surface of the circuit board 1. For this reason, there is little risk that the second through-hole conductor 3b will be a cause of noise by being a so-called stub. Additionally, the through-hole via 3 can be provided in the through-hole 1a, which has the same diameter as a normal through-hole via. For this reason, the through-hole via 3 will seldom place constraints on circuit board mounting plans or conductor pattern design.

The first embodiment will be explained by referring to FIG. 2 and FIG. 3 as examples. In the drawings, the features that are the same as those in FIG. 1 will be assigned the same reference signs and their explanations will be simplified.

Figure 2A:
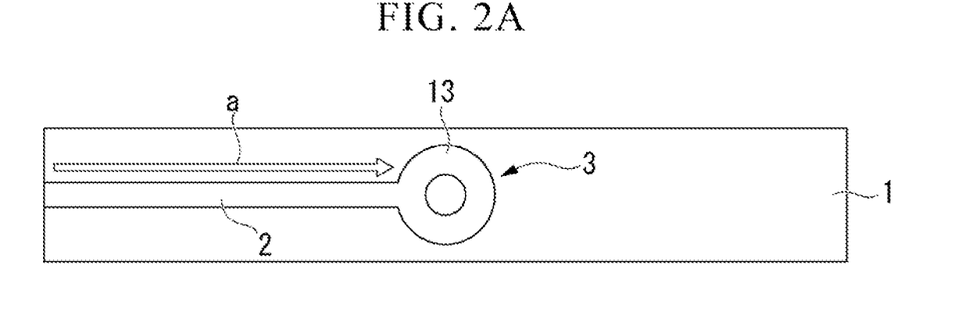
FIG. 2A is a top view illustrating, as a comparative example, a through-hole via not provided with a slit that is employed in a first embodiment.
Figure 2B:
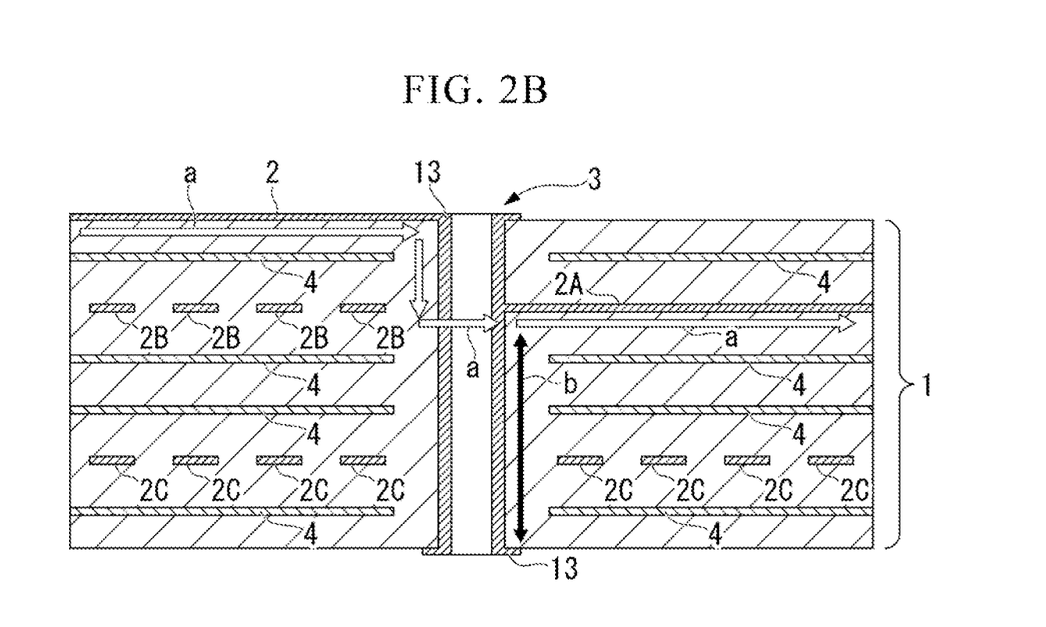
FIG. 2B is a section view illustrating the through-hole via according to the comparative example.
Figure 2C:
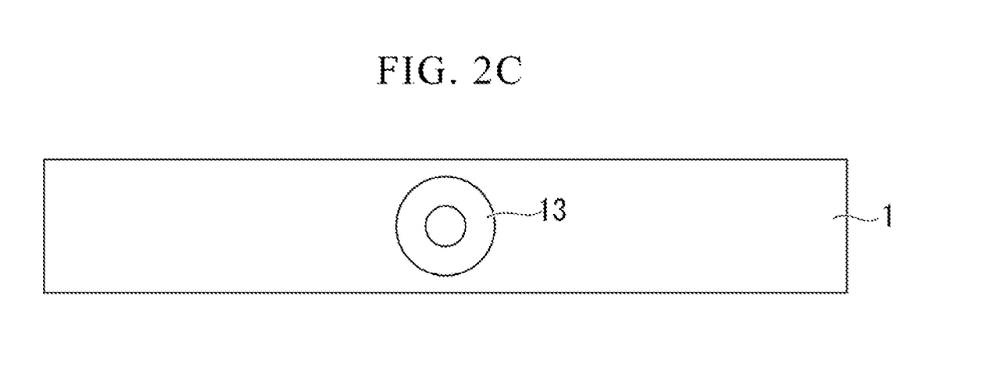
FIG. 2C is a bottom view illustrating the through-hole via according to the comparative example.
Figure 2D:
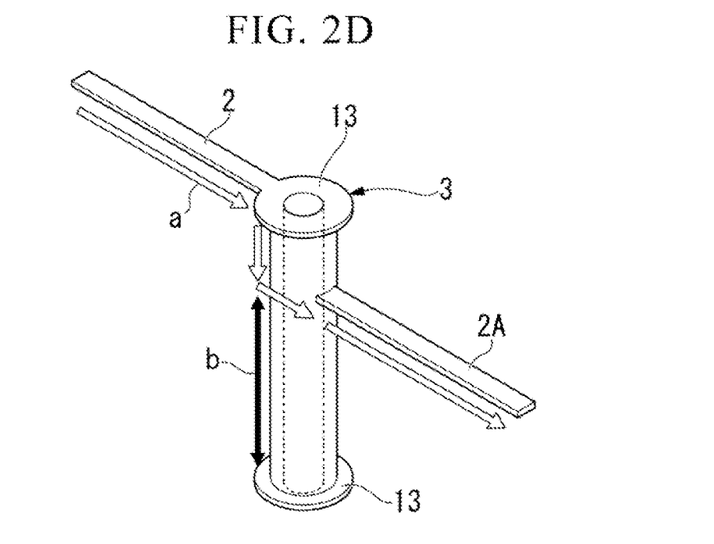
FIG. 2D is a perspective view of only a through-hole via portion in the comparative example.

FIG. 2A to FIG. 2D indicate a comparative example of a through-hole via before applying the structure of the present embodiment. In other words, FIG. 2A to FIG. 2D indicate an example of a through-hole via not provided with a slit. FIG. 2A is a top view of the through-hole via according to the comparative example, FIG. 2B is a section view of the through-hole via according to the comparative example, FIG. 2C is a bottom view of the through-hole via according to the comparative example, and FIG. 2D is a perspective view of only the through-hole via portion in the comparative example.

The circuit board 1 composed of multiple layers is provided with multiple wiring layers in which a conductor pattern 2 is formed on the surface of an insulating layer. In FIG. 2A to FIG. 2C, circuit board layers in the interior of the circuit board 1 are indicated by the reference sign 4, and conductor patterns in the interior are indicated by the reference signs 2A, 2B, and 2C. A through-hole via 3 that penetrates through in the thickness direction is formed in this circuit board 1.

In FIG. 2A to FIG. 2D, an entire through-hole via 3 is formed by a single electrical conductor, for example, copper. Additionally, the conductor pattern 2 is connected to a land 13 on the upper surface of the circuit board 1, as illustrated in FIG. 2A, and the conductor pattern 2 is not connected to a land 13 on the lower surface, as illustrated in FIG. 2C. Additionally, a conductor pattern 2A of an interior circuit layer is connected to an intermediate portion of the through-hole via 3.

As a result of being connected in this way, in the comparative example, the signal transmission path indicated by the arrow a in FIG. 2B or FIG. 2D is formed. In the through-hole via 3 lower than the signal transmission path indicated by the arrow a from the conductor pattern 2 on the upper surface to the conductor pattern 2A, the range indicated by the arrow b in the drawing forms a stub.

Figure 3A:
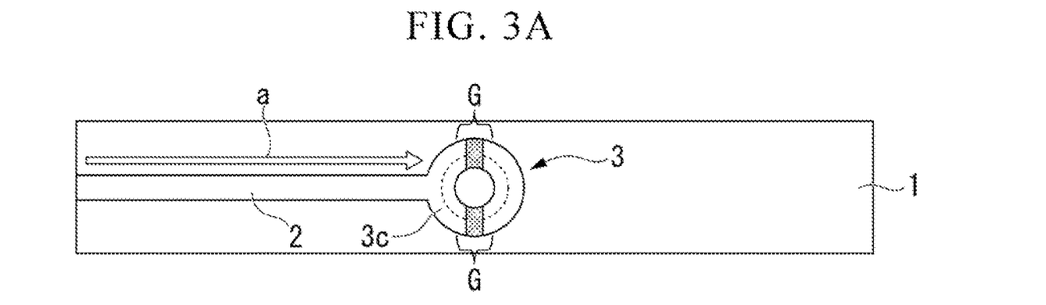
FIG. 3A is a top view illustrating a through-hole via according to the first embodiment.
Figure 3B:
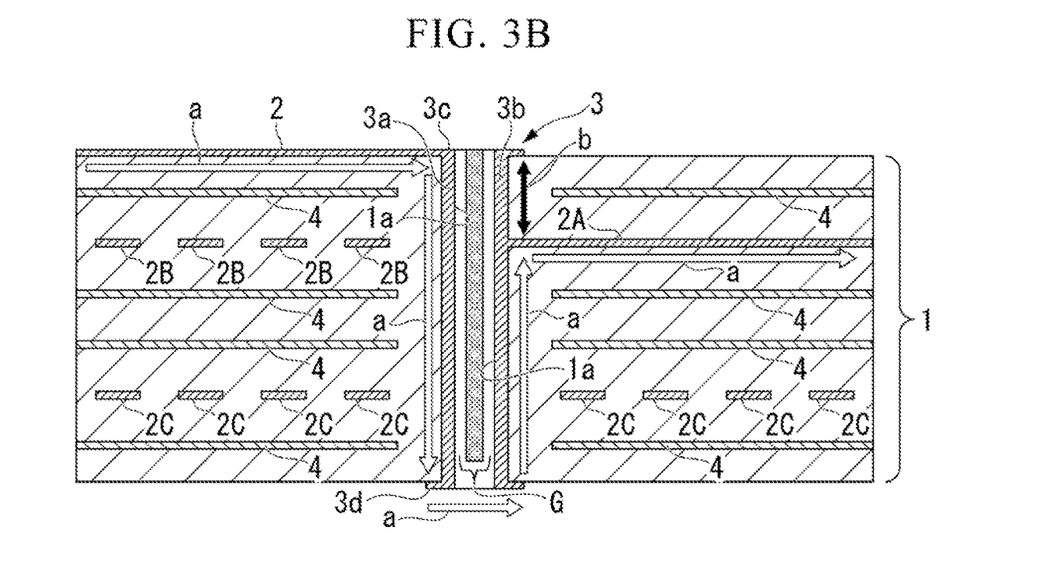
FIG. 3B is a section view illustrating the through-hole via according to the first embodiment.
Figure 3C:
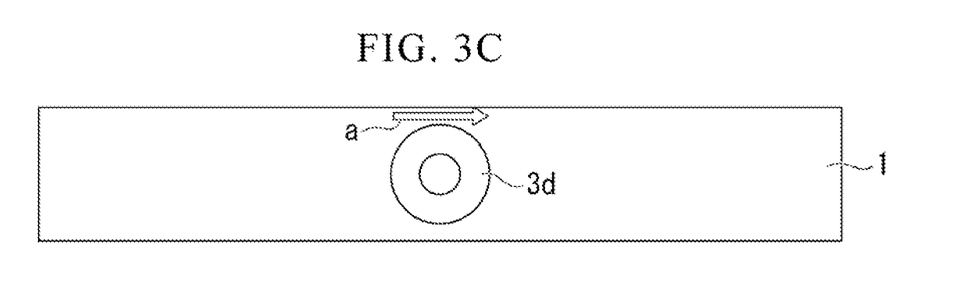
FIG. 3C is a bottom view illustrating the through-hole via according to the first embodiment.
Figure 3D:
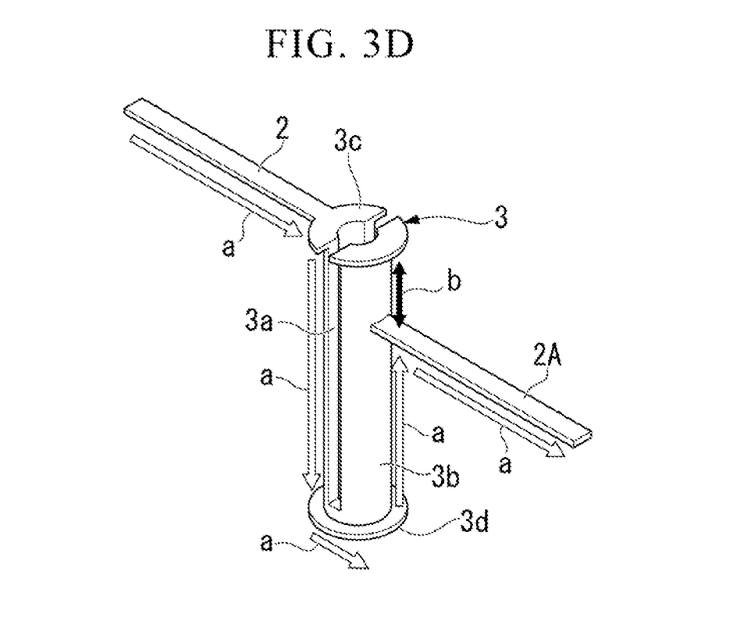
FIG. 3D is a perspective view of only a through-hole via portion in the first embodiment.

FIG. 3A to FIG. 3D illustrate a first embodiment. FIG. 3A is a top view of a through-hole via according to the first embodiment, FIG. 3B is a section view of the through-hole via, FIG. 3C is a bottom view of the through-hole via, and FIG. 3D is a perspective view of only the through-hole via portion. In the drawings, the features that are the same as those in FIG. 1 will be assigned the same reference signs and their explanations will be simplified.

This through-hole via 3 is disposed in a through-hole 1a that penetrates through the circuit board 1, and has a first through-hole conductor 3a, a second through-hole conductor 3b, a first land portion 3c, and a ring-shaped second land portion 3d. The first through-hole conductor 3a is formed from a conductor. The second through-hole conductor 3b is disposed inside the through-hole 1a so as to be spaced, in a circumferential direction of the through-hole 1a, from the first through-hole conductor 3a. A conductor pattern 2A on a circuit layer located on other than an end portion, in the thickness direction, of the circuit board 1 is connected to the second through-hole conductor 3b. The first land portion 3c connects the first through-hole conductor 3a to the conductor pattern 2 on one insulating layer (the layer on the upper surface as illustrated in FIG. 3A). The ring-shaped second land portion 3d connects the first through-hole conductor 3a with the second through-hole conductor 3b, on another insulating layer (the layer on the lower surface as illustrated in FIG. 3C), which does not have any signal connections, other than the one insulating layer.

The first through-hole conductor 3a and the second through-hole conductor 3b can be easily formed, for example, by forming a slit in the thickness direction of the circuit board 1 in a conductor layer formed so as to be a single tube, thereby separating the first through-hole conductor 3a from the second through-hole conductor 3b. Additionally, the first land portion 3c and the second land portion 3d can be formed integrally with the conductor pattern 2 or the through-hole via 3 during processes of plating, trimming or the like when forming the conductor pattern 2 or the through-hole via 3.

The area (assigned reference sign G) indicated by shading with dots in FIG. 3A and FIG. 3B indicates a gap provided between the first through-hole conductor 3a and the second through-hole conductor 3b, the gap actually being a space in which there is no conductor, insulator, or the like. As illustrated in the top view in FIG. 3A, the gap G is formed in a range around the 12 o'clock position, and in a range around the 6 o'clock position, thereby insulating the first through-hole conductor 3a from the second through-hole conductor 3b.

The first land portion 3c is formed, for example, by cutting out a portion of the conductor from a conductor pattern connecting the first through-hole conductor 3a with the second through-hole conductor 3b. For example, the first land portion 3c is provided with multiple conductor patterns that have been divided. According to the example in the top view in FIG. 3A, the divided conductor patterns are fan-shaped. However, the shapes of the conductor patterns are not limited to these examples.

The second land portion 3d connects the first through-hole conductor 3a with the second through-hole conductor 3b on an insulating layer on which a conductor pattern is not formed. The second land portion 3d is, for example, a ring-shaped conductor pattern provided so as to surround the periphery of a hole penetrating through the circuit board 1. The second land portion 3d may be of any shape as long as it electrically connects the first through-hole conductor 3a with the second through-hole conductor 3b.

In the circuit board 1 with the above-mentioned structure, a signal transmission path is formed sequentially from the conductor pattern 2, through the first through-hole conductor 3a, through the second land portion 3d, through the second through-hole conductor 3b, and to the conductor pattern 2A, as indicated by the arrow a in FIG. 3A to FIG. 3D. In this case, the range indicated by the arrow b in the second through-hole conductor 3b above the conductor pattern 2A forms a stub.

In the first embodiment illustrated in FIG. 3A to FIG. 3D, the range indicated by the arrow b forms a stub, and the length of the stub is shorter than that in the case of the comparative example illustrated in FIG. 2A to FIG. 2D. As a result thereof, detrimental influences on the electrical characteristics of the multilayer circuit board caused by increases in the parasitic capacitance generated in dependence on the length (area) of the stub can be reduced.

Thus, the through-hole via 3 has a first through-hole conductor 3a and a second through-hole conductor 3b having ends on the upper and lower surfaces of the circuit board 1, and the first through-hole conductor 3a and the second through-hole conductor 3b are electrically connected at one of the ends on the upper and lower surfaces. The first through-hole conductor 3a and the second through-hole conductor 3b are separated, and are not electrically connected at locations other than the one end. As a result thereof, the length of the stub can be suppressed.

Figure 4A:
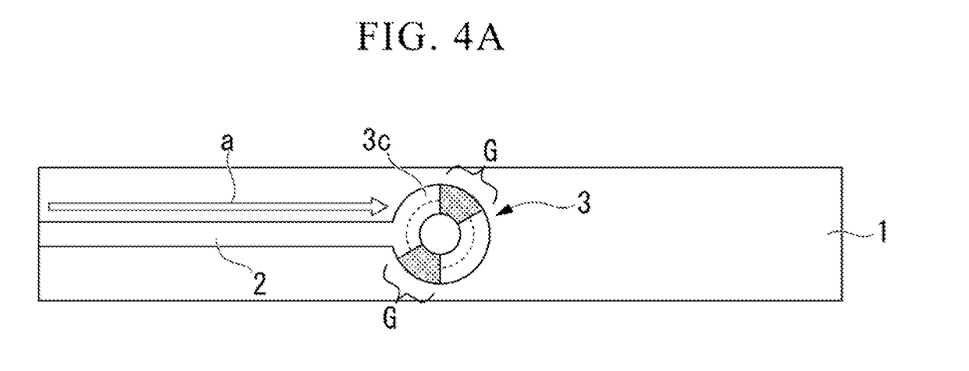
FIG. 4A is a top view illustrating a through-hole via according to a second embodiment.
Figure 4B:
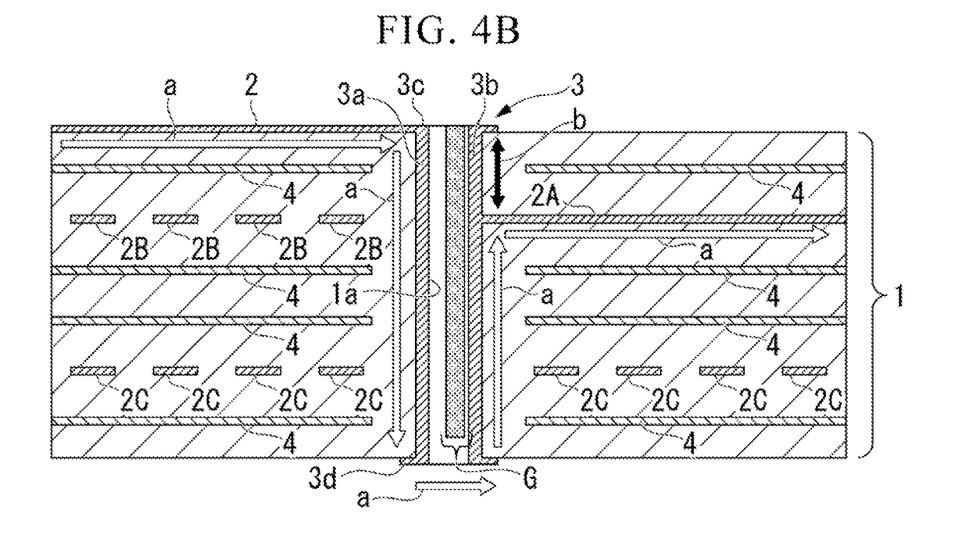
FIG. 4B is a section view illustrating the through-hole via according to the second embodiment.
Figure 4C:
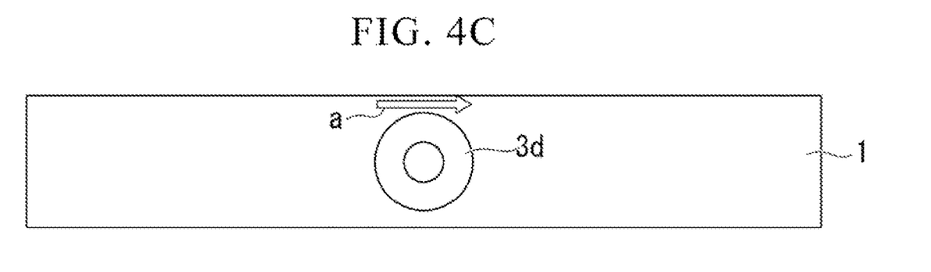
FIG. 4C is a bottom view illustrating the through-hole via according to the second embodiment.
Figure 4D:
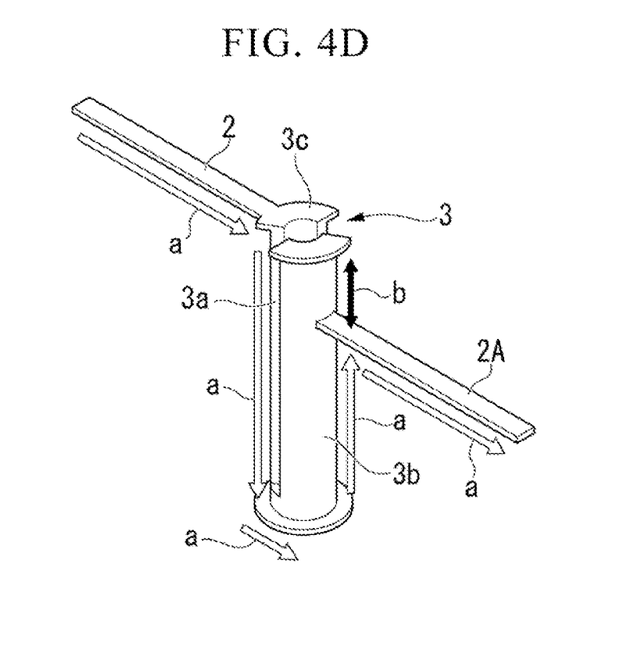
FIG. 4D is a perspective view of only a through-hole via portion in the second embodiment.

FIG. 4A to FIG. 4D illustrate a second embodiment. FIG. 4A is a top view of a through-hole via 3 according to the second embodiment, FIG. 4B is a section view of the through-hole via 3, FIG. 4C is a bottom view of the through-hole via 3, and FIG. 4D is a perspective view of only the through-hole via portion. In FIG. 4, the features that are the same as those in FIG. 3 will be assigned the same reference signs and their explanations will be simplified.

As in the first embodiment, this through-hole via 3 has a first through-hole conductor 3a, a second through-hole conductor 3b, a first land portion 3c, and a second land portion 3d. The second through-hole conductor 3b is disposed inside the through-hole 1a so as to be spaced from the first through-hole conductor 3a. The first land portion 3c connects the first through-hole conductor 3a to the conductor pattern 2 on one insulating layer. The area (assigned reference sign G) indicated by shading with dots in FIG. 4A and FIG. 4B indicates a gap provided between the first through-hole conductor 3a and the second through-hole conductor 3b. As illustrated in the top view in FIG. 4A, the gap G is formed in a range around the 12 o'clock to 2 o'clock positions, and in a range around the 6 o'clock to 8 o'clock positions, thereby insulating the first through-hole conductor 3a from the second through-hole conductor 3b.

In the above-described second embodiment as well, a signal transmission path is formed sequentially from the conductor pattern 2, through the first through-hole conductor 3a, through the second land portion 3d, through the second through-hole conductor 3b, and to the conductor pattern 2A, as indicated by the arrow a in FIG. 4A to FIG. 4D. In this case, the range indicated by the arrow b in the second through-hole conductor 3b above the conductor pattern 2A forms a stub. Therefore, the range indicated by the arrow b forms a stub, and the range forming the stub is shorter than that in the case of the comparative example illustrated in FIG. 2A to FIG. 2D. As a result thereof, detrimental influences on the electrical characteristics of the multilayer circuit board can be reduced.

Figure 5A:
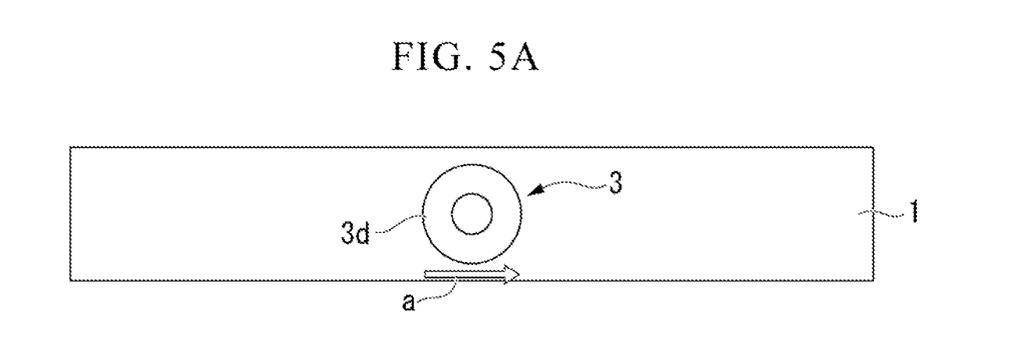
FIG. 5A is a top view illustrating a through-hole via according to a third embodiment.
Figure 5B:
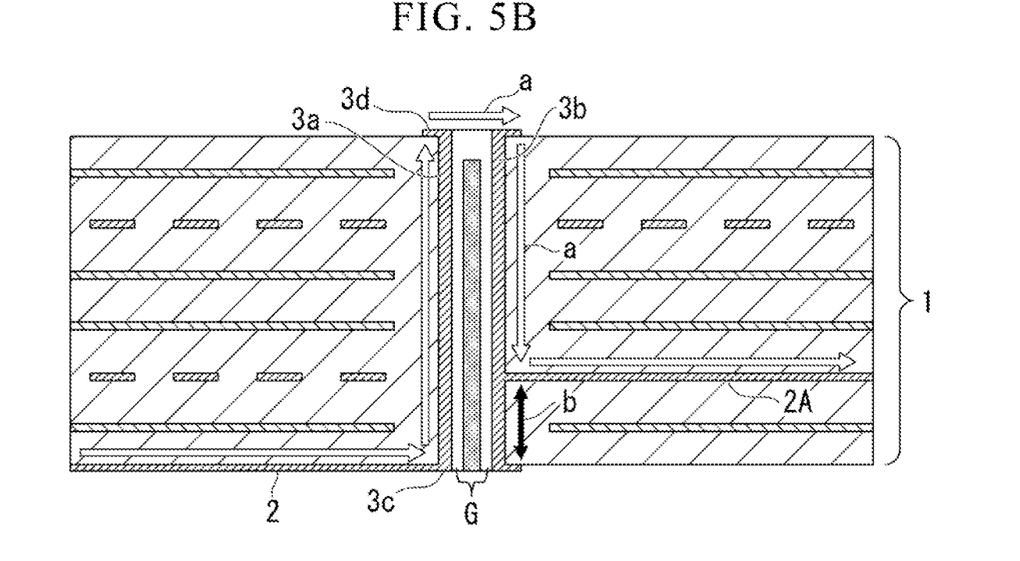
FIG. 5B is a section view illustrating the through-hole via according to the third embodiment.
Figure 5C:
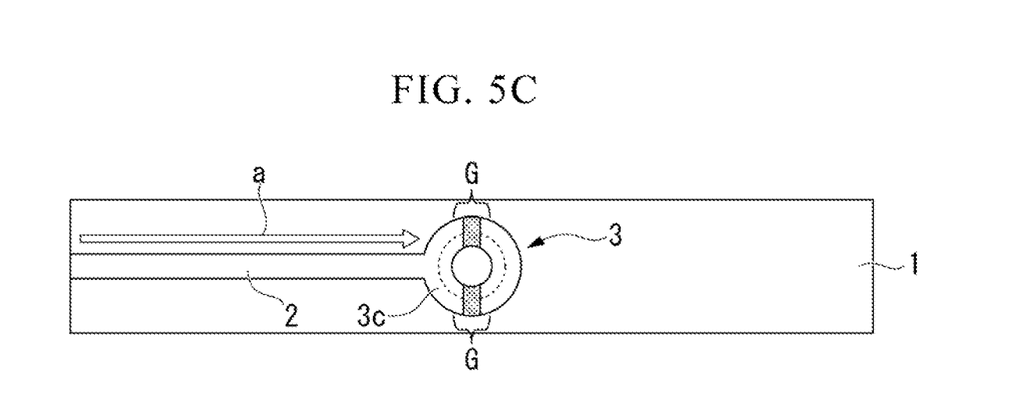
FIG. 5C is a bottom view illustrating the through-hole via according to the third embodiment.
Figure 5D:
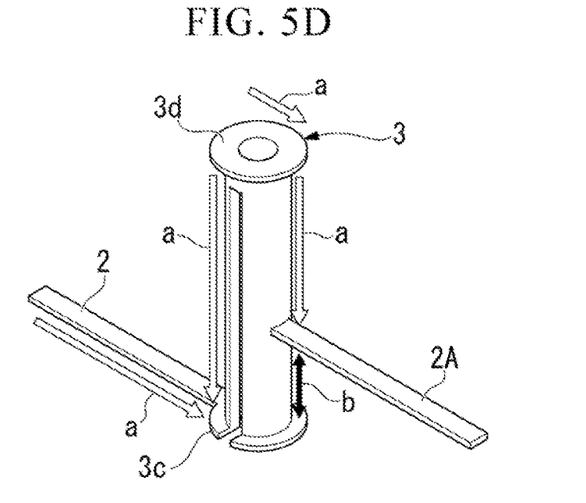
FIG. 5D is a perspective view of only a through-hole via portion in the third embodiment.

FIG. 5A to FIG. 5D illustrate a third embodiment. FIG. 5A is a top view of a through-hole via 3 according to the third embodiment, FIG. 5B is a section view of the through-hole via, FIG. 5C is a bottom view of the through-hole via 3, and FIG. 5D is a perspective view of only the through-hole via 3 portion. In FIG. 5, the features that are the same as those in FIG. 1 will be assigned the same reference signs and their explanations will be simplified.

As in the first embodiment and the second embodiment, this through-hole via 3 has a first through-hole conductor 3a, a second through-hole conductor 3b, a first land portion 3c, and a second land portion 3d. The second through-hole conductor 3b is disposed inside the through-hole 1a so as to be spaced from the first through-hole conductor 3a. A conductor pattern 2A on a circuit layer located towards the lower surface of the circuit board 1 is connected to the second through-hole conductor 3b. The first land portion 3c connects the first through-hole conductor 3a to the conductor pattern 2 on one insulating layer. The area (assigned reference sign G) indicated by shading with dots in FIG. 5B and FIG. 5C indicates a gap provided between the first through-hole conductor 3a and the second through-hole conductor 3b. As illustrated in the bottom view in FIG. 5C, the gap G is formed in a range around the 12 o'clock position, and in a range around the 6 o'clock position, thereby insulating the first through-hole conductor 3a from the second through-hole conductor 3b.

In the third embodiment, the conductor pattern 2A connected to the second through-hole conductor 3b is disposed at a location towards the lower surface of the circuit board 1. Therefore, the second land portion 3d is connected to the first land portion 3c on the top surface of the circuit board 1, i.e., on the side further from the conductor pattern 2A. As a result thereof, the stub b is arranged to be shorter.

Thus, the second land portion 3d electrically connecting the first through-hole conductor 3a with the second through-hole conductor 3b is provided on the surface, of the upper and lower surfaces of the circuit board 1, that is more distant from the conductor pattern 2A. That is, of the ends of the circuit board 1 in the thickness direction, the first through-hole conductor 3a and the second through-hole conductor 3b are electrically connected at the end that is more distant from the conductor pattern 2A.

In other words, the first land portion 3c not electrically connecting the first through-hole conductor 3a with the second through-hole conductor 3b is provided on the surface, of the upper and lower surfaces of the circuit board 1, that is less distant from the conductor pattern 2A. That is, of the ends of the circuit board 1 in the thickness direction, the first through-hole conductor 3a and the second through-hole conductor 3b are not electrically connected at the end that is less distant from the conductor pattern 2A.

Thus, the first through-hole conductor 3a and the second through-hole conductor 3b are electrically connected at only one of the surfaces (ends), based on the distance from the upper and lower surfaces (ends) of the circuit board 1 to the conductor pattern 2A. For this reason, the distance to the insulating layer on which the conductor pattern 2A is formed is greater for the other insulating layer on which the second land portion 3d electrically connects the first through-hole conductor 3a with the second through-hole conductor 3b than for the one insulating layer on which the conductor pattern 2 is formed. By providing the first land portion 3c and the second land portion 3d in accordance with the arrangement of the conductive pattern 2A, the range of the stub can be effectively suppressed.

In the above-described third embodiment as well, a signal transmission path is formed sequentially from the conductor pattern 2 on the lower surface, through the first through-hole conductor 3a, through the second land portion 3d, through the second through-hole conductor 3b, and to the conductor pattern 2A, as indicated by the arrow a in FIG. 5A to FIG. 5D. In this case, the range indicated by the arrow b in the second through-hole conductor 3b below the conductor pattern 2A forms a stub. Therefore, the range indicated by the arrow b forms a stub, and the range forming the stub is shorter than that in the case of the comparative example illustrated in FIG. 2A to FIG. 2D. As a result thereof, detrimental influences on the electrical characteristics of the multilayer circuit board can be reduced.

In the above-described first to third embodiments, the first land portion was provided on one of the upper surface or the lower surface and the second land portion was provided on the other. However, the structure is not limited to this example. One or both of the first land portion and the second land portion may be provided in an intermediate layer in the circuit board having the multilayer structure. In other words, the positions and the number of first land portions and second land portions, or the number and the arrangement of through-hole vias, should be determined in accordance with which of the circuit layers is more easily influenced by stubs, taking into consideration the differences in the electrical characteristics between the respective layers or the differences in the frequencies of signals flowing in the respective layers.

While first to third embodiments have been explained in detail by referring to the drawings, the specific configuration is not limited to these embodiments, and design changes and the like within a range not departing from the spirit of the present invention are also included.

The present application claims the benefit of priority based on Japanese Patent Application No. 2019-051030, filed Mar. 19, 2019, the entire disclosure of which is incorporated herein by reference.

INDUSTRIAL APPLICABILITY

The present invention can be used in circuit boards in which conductor pattern circuits are provided across multiple layers.

REFERENCE SIGNS LIST

1 Circuit board (multilayer board)
2, 2A, 2B, 2C Conductor pattern (circuit conductor)

3 Through-hole via
3a First through-hole conductor
3b Second through-hole conductor
3c First land portion
3d Second land portion
4 Circuit board layer
13 Land

What is claimed is:

1. A through-hole via penetrating, in a thickness direction, through a circuit board provided with multiple wiring layers in which a conductor pattern is formed on a surface of a first insulating layer, wherein the through-hole via comprising:
   a first through-hole conductor that is disposed inside a hole penetrating through the circuit board and that is formed from a conductor;
   a second through-hole conductor that is disposed inside the hole so as to be spaced, in a circumferential direction of the hole, from the first through-hole conductor;
   a first land portion that connects the first through-hole conductor to the conductor pattern on the first insulating layer; and
   a second land portion that connects the first through-hole conductor with the second through-hole conductor on a second insulating layer different from the first insulating layer and on which the conductor pattern is not formed,
   wherein the first land portion is provided so as to surround a periphery of the hole between the first through-hole conductor and the second through-hole conductor, and is formed by cutting away a portion of a ring-shaped conductor on a ring-shaped conductor pattern connecting the first through-hole conductor and the second through-hole conductor to each other, and separating the first through-hole conductor and the second through-hole conductor from each other,
   the second land portion is a ring-shaped conductor pattern that is provided so as to surround the periphery of the hole between the first through-hole conductor and the second through-hole conductor and that connects the first through-hole conductor and the second through-hole conductor to each other,
   the second land portion connects the first through-hole conductor with the second through-hole conductor on the second insulating layer, the second land portion more distant from the first insulating layer than from the second insulating layer, and
   the first through-hole conductor and the second through-hole conductor are formed by forming a slit in a thickness direction of the circuit board in a conductor layer formed so as to be a single tube to separate the first through-hole conductor from the second through-hole conductor.

2. The through-hole via according to claim 1, wherein the second land portion connects the first through-hole conductor and the second through-hole conductor to each other on the second insulating layer, on which the conductor pattern, through which a signal flows, is not formed.

3. The through-hole via according to claim 1, wherein the first land portion is provided on either an upper or a lower surface of the circuit board and the second land portion is provided on the other of the upper or the lower surface of the circuit board.

4. A circuit board comprising:
   a through-hole via penetrating, in a thickness direction, through the circuit board provided with multiple wiring layers in which a conductor pattern is formed on a surface of first insulating layer; and
   multiple layers of conductor patterns,
   wherein the through-hole via includes:
      a first through-hole conductor that is disposed inside a hole penetrating through the circuit board and that is formed from a conductor;
      a second through-hole conductor that is disposed inside the hole so as to be spaced, in a circumferential direction of the hole, from the first through-hole conductor;
      a first land portion that connects the first through-hole conductor to the conductor pattern on the first insulating layer; and
      a second land portion that connects the first through-hole conductor with the second through-hole conductor on a second insulating layer different from the first insulating layer and on which the conductor pattern is not formed,
   wherein the first land portion is provided so as to surround a periphery of the hole between the first through-hole conductor and the second through-hole conductor, and is formed by cutting away a portion of a ring-shaped conductor on a ring-shaped conductor pattern connecting the first through-hole conductor and the second through-hole conductor to each other, and separating the first through-hole conductor and the second through-hole conductor from each other,
   the second land portion is a ring-shaped conductor pattern that is provided so as to surround the periphery of the hole between the first through-hole conductor and the second through-hole conductor and that connects the first through-hole conductor and the second through-hole conductor to each other,
   the second land portion connects the first through-hole conductor with the second through-hole conductor on the second insulating layer, the second land portion more distant from the first insulating layer than from the second insulating layer, and
   the first through-hole conductor and the second through-hole conductor are formed by forming a slit in a thickness direction of the circuit board in a conductor layer formed so as to be a single tube to separate the first through-hole conductor from the second through-hole conductor.

* * * * *